(12) United States Patent
Perry et al.

(10) Patent No.: US 8,025,749 B2
(45) Date of Patent: Sep. 27, 2011

(54) ULTRAFINE-GRAIN-COPPER-BASE SPUTTER TARGETS

(75) Inventors: Andrew C. Perry, Oradell, NJ (US); Paul S. Gilman, Suffern, NY (US)

(73) Assignee: Praxair S. T. Technology, Inc., North Haven, CT (US)

( * ) Notice: Subject to any disclaimer, the term of this patent is extended or adjusted under 35 U.S.C. 154(b) by 1009 days.

(21) Appl. No.: 11/019,713

(22) Filed: Dec. 23, 2004

(65) Prior Publication Data
US 2005/0133125 A1    Jun. 23, 2005

Related U.S. Application Data

(62) Division of application No. 10/198,256, filed on Jul. 18, 2002, now Pat. No. 6,896,748.

(51) Int. Cl.
*C21D 6/04* (2006.01)
(52) U.S. Cl. ......... 148/577; 148/679; 148/680; 148/681
(58) Field of Classification Search ............ 148/577, 148/679, 680, 681
See application file for complete search history.

(56) References Cited

U.S. PATENT DOCUMENTS

| | | | |
|---|---|---|---|
| 4,083,220 A | 4/1978 | Kobayashi et al. | 72/364 |
| 4,159,217 A | 6/1979 | Selines et al. | 148/11.5 |
| 5,600,989 A | 2/1997 | Segal et al. | 72/253.1 |
| 5,766,380 A | 6/1998 | Lo et al. | 148/577 |
| 5,993,575 A | 11/1999 | Lo et al. | 148/577 |
| 5,993,621 A | 11/1999 | Liu | 204/298.12 |
| 6,139,701 A | 10/2000 | Pavate et al. | 204/192.17 |
| 6,197,129 B1 | 3/2001 | Zhu et al. | 148/400 |
| 2001/0023726 A1 | 9/2001 | Koenigsmann et al. | 148/681 |

FOREIGN PATENT DOCUMENTS

| | | |
|---|---|---|
| EP | 799905 | 10/1997 |
| JP | 3115562 | 5/1991 |
| WO | 0015863 | 3/2000 |

OTHER PUBLICATIONS

Pelton, A.D., Cu—Li binary phase diagram, ASM handbook, vol. 3, Alloy Phase Diagrams, 1990.*
Rigney et al., "Deformation Substructures Associated with Very Large Plastic Strains", Scripta Metallurgica, vol. 27 (1992) pp. 975-980.
Valiev et al., "Structure and Mechanical Behavior of Ultrafine-Grained Metals and Alloys Subjected to Intense Plastic Deformation", Physics of Metals and Metallography, vol. 85, No. 3 (1998) pp. 367-377.

(Continued)

*Primary Examiner* — Sikyin Ip
(74) *Attorney, Agent, or Firm* — Iurie A. Schwartz

(57) ABSTRACT

The sputter target has a composition selected from the group consisting of high-purity copper and copper-base alloys. The sputter target's grain structure is at least about 99 percent recrystallized; and the sputter target's face has a grain orientation ratio of at least about 10 percent each of (111), (200), (220) and (311). In addition, the sputter target has a grain size of less than about 10 μm for improving sputter uniformity and reducing sputter target arcing.

9 Claims, 3 Drawing Sheets

OTHER PUBLICATIONS

Nakashima et al., "Influence of Channel Angle on the Development of Ultrafine Grains in Equal-Channel Angular Pressing", Acta Metallurgica, vol. 46, No. 5 (1998) pp. 1589-1599. Shin et al., "Grain Refinement of a Commercial 0.15%C Steel by Equal-Channel Angular Pressing", Scripta Metallurgica, vol. 41, No. 3 (1999) pp. 259-262.

Tsuji et al., "Ultra-Fine Grained Bulk Steel Produced by Accumulative Roll-Bonding (ARB) Process", Scripta Metallurgica, vol. 40, No. 7 (1999) pp. 795-800.

Sun et al., "Characteristics of Submicron Grained Structure Formed in Aluminum by Equal Channel Angular Extrusion", Materials Science and Engineering (2000) pp. 82-85.

* cited by examiner

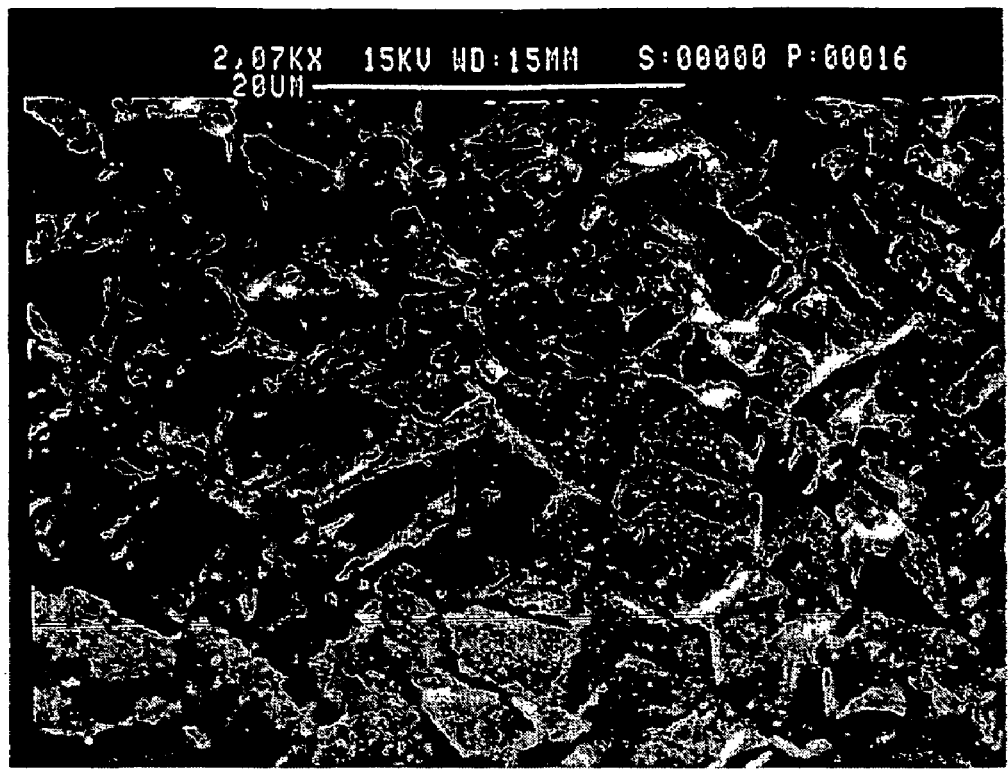
- Figure 1 -
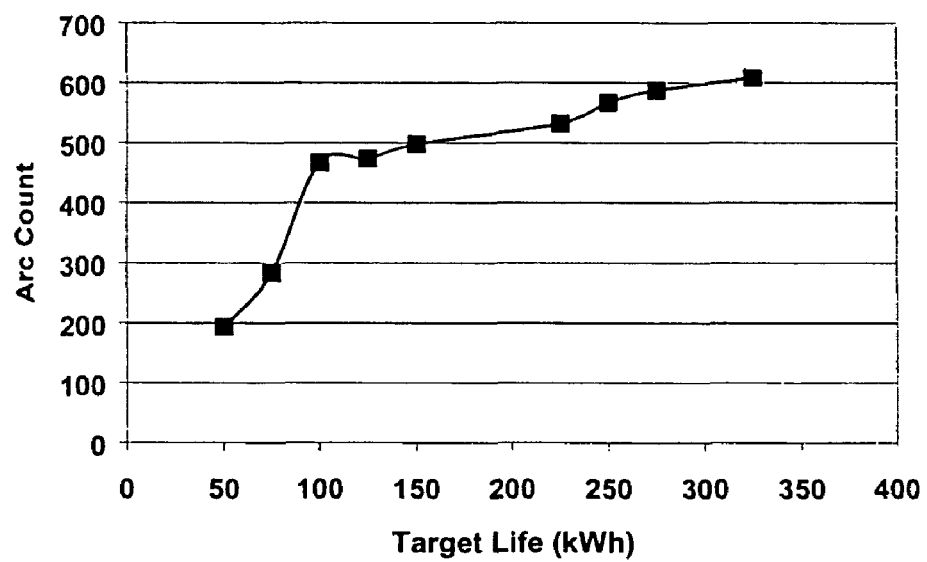
- Figure 2A -

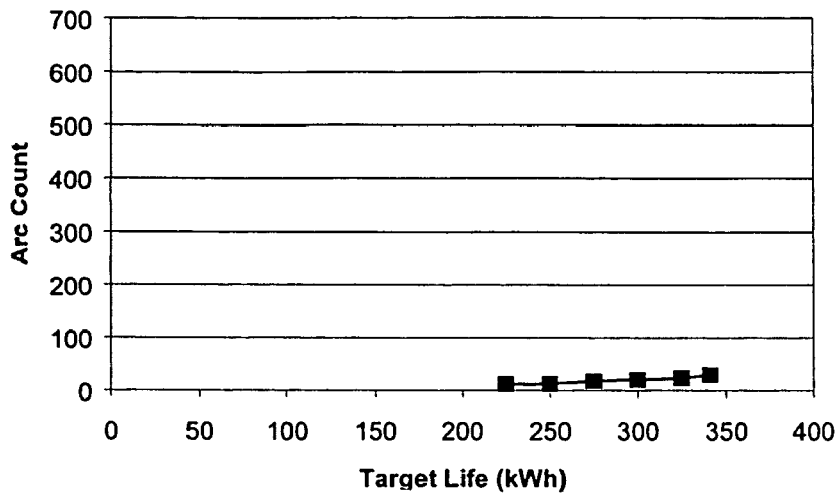
- Figure 2B -
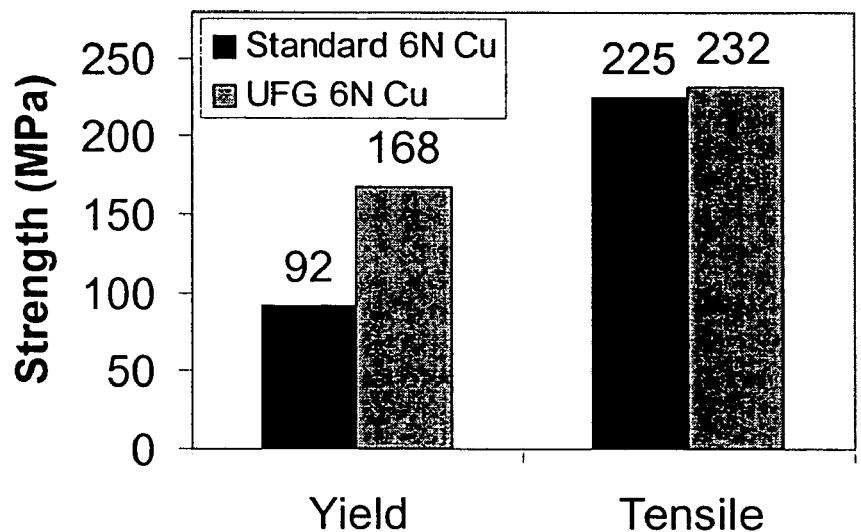
- Figure 3 -
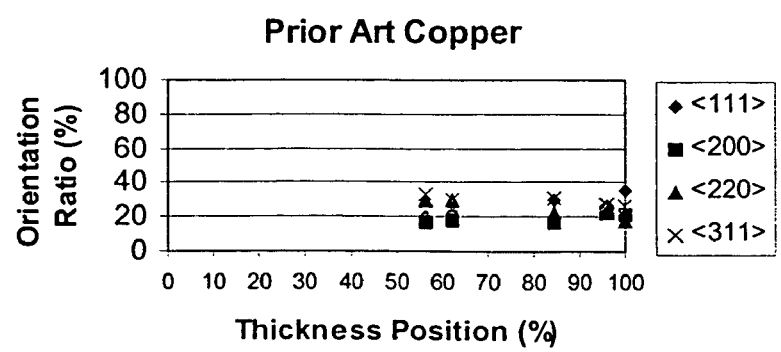
-Figure 4A-

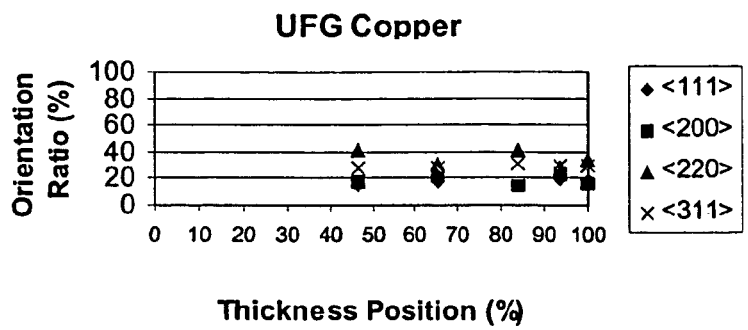
- Figure 4B -
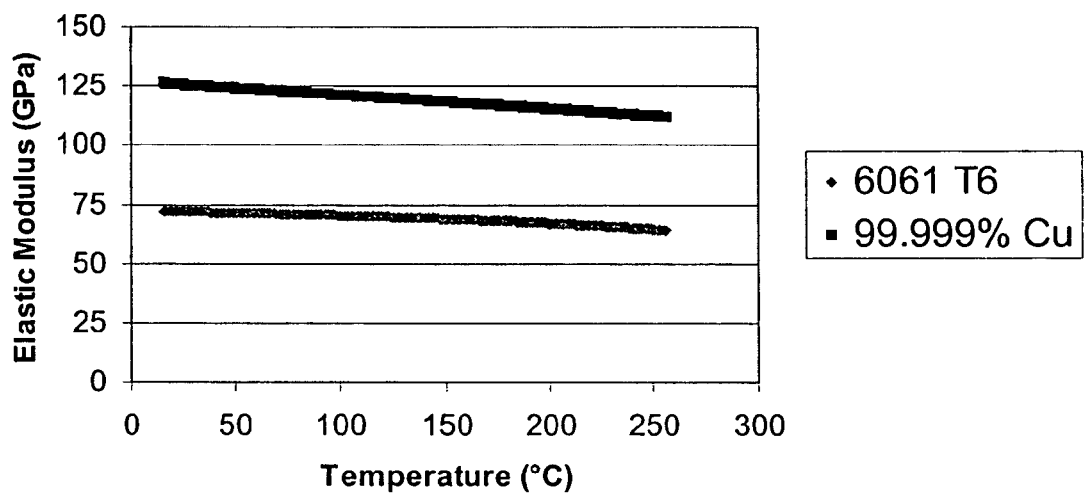
- Figure 5 -

ULTRAFINE-GRAIN-COPPER-BASE SPUTTER TARGETS

RELATED APPLICATIONS

This application is a divisional of prior U.S. application Ser. No. 10/198,256, filed Jul. 18, 2002 now U.S. Pat. No. 6,896,748.

BACKGROUND OF THE INVENTION

Recently, researchers have focused on the refinement of sputter target microstructures based on optimizing cold-working and recrystallizing heat treatments (annealing). Unfortunately, these techniques have experienced limited success for refining high-purity copper and copper alloy microstructures. Despite the relative ease of refining copper and copper alloys' microstructure, manufacturers are reliant upon conventional working and annealing to produce acceptable results. Most commercial manufacturers of copper sputter targets tend to produce sputter targets having a grain size between about 25 and 100 μm.

Koenigsmann et al. in US Pat. Pub. No. 2001/0023726 disclose the advantage of limiting a sputter target's grain size and controlling crystallographic texture orientation ratios to improve sputter uniformity. Koenigsmann's process relies upon a combination of warm working, cold working and annealing to produce high-purity copper sputter targets having a relatively fine grain size and a balanced grain structure orientation. This process successfully produces sputter targets having a grain size on the order of 20 μm.

Pavate et al., in U.S. Pat. No. 6,139,701, disclose controlling multiple target properties using conventional production processes to lower sputter target micro-arcing for high-purity copper targets. This patent suggests reducing dielectric inclusions, grain size and surface roughness to limit defects arising from field enhanced emissions.

Despite the recent improvements achieved by Koenigsmann et al. and proposed by Pavate et al., conventional copper working processes have limited success with respect to refining microstructures to ultrafine grain sizes. This is because at normal working temperatures (ambient) copper and copper alloys reach a limiting-steady-state dislocation density and subgrain or cell size. And upon annealing this structure recrystallizes into a relatively coarse grain structure.

Target manufacturers have relied upon equal channel angular extrusion (ECAE) to produce fine grain microstructures. Nakashima et al., "Influence of Channel Angle on the Development of Ultrafine Grains in Equal-Channel Angular Pressing," Acta. Mater., Vol. 46, (1998), pp. 1589-1599 and R. Z. Valiev et al., "Structure and Mechanical Behavior of Ultrafine-Grained Metals and Alloys Subjected to Intense Plastic Deformation," Phys. Metal. Metallog., Vol. 85, (1998), pp. 367-377 provide examples of using ECAE to reduce grain size. ECAE introduces an enormous strain into a metal without imparting significant changes in workpiece shape. In fact sputter target manufacturers have claimed an ability to use ECAE to reduce the grain size of high-purity copper sputter targets to less than 5 μm. Although this process is effective for reducing grain size, it does not appear to align grains in a manner that facilitates uniform sputtering or provide an acceptable yield—the low yield originates from the ECAE process operating only with rectangular shaped plate and thus, requiring an inefficient step of cutting circular targets from the rectangular plate.

Lo, et al., in U.S. Pat. No. 5,766,380, entitled "Method for Fabricating Randomly Oriented Aluminum Alloy Sputtering Targets with Fine Grains and Fine Precipitates" disclose a cryogenic method for fabricating aluminum alloy sputter targets. This method uses cryogenic processing with a final annealing step to recrystallize the grains and control grain structure. Similarly, Y. Liu, in U.S. Pat. No. 5,993,621 uses cryogenic working and annealing to manipulate and enhance crystallographic texture of titanium sputter targets.

SUMMARY OF THE INVENTION

The sputter target has a composition selected from the group consisting of high-purity copper and copper-base alloys. The sputter target's grain structure is at least about 99 percent recrystallized; and the sputter target's face has a grain orientation ratio of at least about 10 percent each of (111), (200), (220) and (311). In addition, the sputter target has a grain size of less than about 10 μm for improving sputter uniformity and reducing sputter target arcing.

The method forms copper-base sputter targets by first cooling a copper-base target blank to a temperature of less than about −50° C. The copper-base target blank has a purity of at least 99.999 percent and grains having an initial grain size. Then deforming the cooled copper-base target blank introduces strain into the copper-base target blank and forms a deformed grain structure. After deformation, recrystallizing the deformed grain structure at a temperature below about 350° C. forms a target blank having recrystallized grains. The target blank has at least about 99 percent recrystallized grains and the recrystallized grains have a fine grain size smaller than the initial grain size. Finally, finishing the copper-base target blank at a low temperature sufficient to maintain the fine grain size forms a finished sputter target.

BRIEF DESCRIPTION OF THE FIGURES

FIG. 1 is a micrograph of ultrafine grained 99.9993% pure copper with a grain size of 3.8 microns.

FIGS. 2A and 2B represent comparative plots for arc count versus target life between standard cold rolled and annealed 99.9993% pure copper having a grain size of 33 μm and cryogenic rolled and low-temperature annealed 99.9993% pure copper having an ultrafine grain size of 3.8 μm, respectively.

FIG. 3 contains a yield strength and tensile strength comparison plot between standard cold rolled and annealed copper having a grain size of 45 μm and cryogenic rolled and low-temperature annealed copper having an ultrafine grain size of 3.6 μm for 99.9999% pure copper.

FIGS. 4A and 4B provide crystallographic texture orientation ratios between standard cold rolled and annealed 99.9999% pure copper having a grain size of 45 μm and cryogenic rolled and low-temperature annealed 99.9999% pure copper having a grain size of 3.6 μm, respectively.

FIG. 5 is a plot of modulus versus temperature that compares 99.999% copper to aluminum alloy 6061 with a T6 treatment condition.

DETAILED DESCRIPTION

It has been discovered that lowering deformation temperature of high-purity copper and copper-base alloys to at least −50° C. lowers the temperature of the recrystallization event and results in a fine grain size. Then heating the target blank to a temperature less than 350° C. stabilizes the fine microstructure with a minimum amount of grain growth. This process produces a fine-grained-recrystallized structure having excellent stability at temperatures encountered during sputtering.

In particular, the process for manufacturing the copper targets first introduces severe plastic straining at cryogenic temperatures with the intent of increasing the number of viable new grain nucleation sites for subsequent activation during a low-temperature recrystallization annealing treatment. This increases the number of nuclei (N) from intense plastic deformation, reduces the subsequent growth rate (G) of the new grains and results in a reduced recrystallized grain size.

The cryogenic process exploits reduced grain boundary mobility by forcing the recrystallization event to occur at low temperatures. Hence, cryogenic working maximizes the ratio of N to G by both the intense plastic straining and retarded dynamic recovery associated with deformation at cryogenic temperatures (increasing N), and the reduced growth rate of newly formed grains by allowing recrystallization to occur at lower temperatures (reducing G). Maximizing the ratio of N to G allows minimization of the recrystallized grain size. Then controlling grain growth during subsequent processing of the target blank into a finished sputter target maintains the resulting minimum grain size.

The broad application of lower-than-normal deformation temperatures by immersing target blanks into cooling baths immediately prior to forming operations achieves a highly worked deformed state. Then annealing at low temperatures, produces new fully recrystallized grains of relatively small size that replace the deformed grains.

This process produces both copper-base alloy and high-purity copper sputter targets having at least about 99 percent of the copper recrystallized. For purposes of this specification, high purity refers to copper having a purity of at least 99.99 percent by weight; and copper-base alloys refer to copper alloys containing predominantly copper and having a purity of less than 99.99 weight percent. This specification refers to all compositions by weight percent, unless specifically expressed otherwise. This process is effective for targets having a copper purity of at least 99.99 weight percent. In addition, this process is useful for targets having a purity of at least 99.999 weight percent and most advantageously as high as 99.9999 weight percent copper. For copper-base alloys, the alloy most advantageously contains less than ten weight percent non-copper constituent by weight percent.

The finished grains have a grain size of less than about 10 µm. This represents a significant improvement in grain size over standard high-purity copper targets. Furthermore, this process can advantageously maintain grain size to levels less than about 8 µm. Most advantageously, this process maintains grain size at levels of about 0.1 to 7.5 µm.

For purposes of this specification, orientation ratio defines the relative proportion of a particular grain orientation in relation to total grains, expressed in percent as measured perpendicular a sputter target's face. For example, measuring the intensity of an x-ray peak and dividing it by the relative intensity of that peak measured in a random orientation powder standard calculates grain orientation ratio. This ratio is then multiplied by 100 percent and normalized, i.e. divided by the sum of all grain orientation ratios between the intensities and their corresponding relative intensities.

The finished sputter target face advantageously has a grain orientation ratio of at least about ten percent of each of the (111), (200), (220) and (311). Most advantageously, the finished sputter target face has a grain orientation ratio of at least about fifteen percent of each of the (111), (200), (220) and (311). This balanced combination of (200), (111), (220) and (311) orientation ratios provides the most uniform sputter properties.

First cooling a high-purity target blank to a temperature of less than about −50° C. prepares the blank for deformation. The cooling medium may be any combination of solid or liquid $CO_2$, liquid nitrogen, liquid argon, helium, or other supercooled liquid. Advantageously, the process lowers the blank to about −80° C. Most advantageously, the process cools the blank to at least about −196° C. or 77 K. The most practical temperature for most applications is 77 K (liquid nitrogen at atmospheric pressure).

After cooling, deforming the cooled high-purity target blank introduces intense strain into the high-purity target blank. The deforming process may include processes such as, pressing, rolling, forging to form a deformed grain structure and to subsequently achieve fine grain sizes upon low-temperature annealing. During deformation, it is important to limit heating of the target blank. Furthermore, it is advantageous to enter an engineering strain of at least about 50 percent into the target blank. This strain ensures uniform microstructure through the target's thickness.

Rolling has proven to be the most advantageous method for reducing grain size and achieving the desired texture. In particular, multiple pass rolling, with re-cooling to cryogenic temperatures at least once between passes provides the most advantageous results. Most advantageously, the re-cooling occurs between each pass. But for some applications, re-cooling after every second pass is sufficient.

The grains in the target blank recrystallize at a temperature below about 350° C. At this temperature, at least about 99 percent of the grains recrystallize. Advantageously, the grains recrystallize at a temperature below about 320° C. Most advantageously, the grains recrystallize at a temperature between about 150 and 320° C. As discussed above, minimizing the recrystallization temperature reduces the target's grain size.

The finishing of the high-purity target blank into a finished sputter target occurs at a temperature sufficient to maintain the fine grain size. If the sputter target is finished at too high of a temperature, then the beneficial grain size reduction is lost. Advantageously, the finishing occurs at a temperature less than about 200° C. to limit grain growth. Reducing finishing temperature to less than about 100° C. further decreases grain growth during finishing. Most advantageously, the finishing occurs at ambient temperature.

The finished target has excellent mechanical properties. Advantageously, the process produces high-purity copper targets having a yield strength of at least about 140 MPa; and most advantageously, it produces high-purity copper targets having a yield strength of at least about 150 MPa. For purposes of this specification, mechanical properties refer to properties as measured at room temperature, unless the specification specifically references another temperature. The high strength of the ultrafine grain size copper in combination with the high elastic modulus of copper (which significantly exceeds that achieved with the typical backing plate alloy, Al 6061 T6) allows the fabrication of large diameter copper sputter targets into monoblock configurations. In addition to this, because copper and copper alloys have significantly higher heat transfer than aluminum alloys, monoblock sputter targets having the design of the invention can sputter at lower temperature with limited deflection of the sputter target.

After the initiating of sputtering or "burning in" the target, the sputter target face advantageously has a surface roughness of less than 150 microinches (3.8 micrometers) Ra to limit intra-target arcing. And most advantageously the sputter target face has a surface roughness of less than 100 microinches (2.5 micrometers) Ra after the target's burn in to limit intra-target arcing.

Example 1

This Example used full-size RMX 12 Eclipse-style sputter targets fabricated from copper having a purity of 99.9993 percent. The final target blank dimensions are a diameter of 12.0" (30.5 cm) and a thickness of 0.437" (1.11 cm). Table 1 provides the manufacturing process specified for this target. In the cryogenic-pressing step (step 2), an operator immersed a 5.0" (12.7 cm) diameter by 3.75" (9.53 cm) long workpiece in liquid nitrogen until visible boiling was no longer observed; the workpiece was then at a temperature of approximately 77 K or −196° C. Re-cooling the cryogenically processed billets between each pressing step ensured that the imposed deformation took place at a temperature as close to −196° C. or 77 K as reasonably possible.

Initial cooling and re-cooling steps extended until the workpiece no longer boiled the liquid nitrogen that surrounded its surface. Immediately after immersing room temperature metals in liquid nitrogen, the liquid adjacent to the metal surface boiled so rapidly that it formed an unbroken gas film that surrounded the workpiece or underwent "film boiling". During film boiling, the gas barrier limited heat transfer. As the temperature of the workpiece decreased and the metal approached −196° C., the gas film barrier began to break down and the liquid contacted the metal surface before boiling. Heat transfer was relatively rapid during this "nucleate boiling" stage. The boiling rate during nucleate boiling was significantly higher than that of film boiling. An interesting observation from the full-scale trials was that when the workpieces approached −196° C., an audible change in boiling state signaled the transition from film to nucleate boiling.

After pre-cooling was complete, pressing the copper workpiece between flat dies in four steps (approximately equal reductions) reduced the thickness to a final height of 1.4" (3.56 cm). Between each reduction step, immersing the workpiece in the liquid nitrogen bath re-cooled the work piece to approximately 77 K or −196° C. In between pressing steps and after pressing was complete, immediately transferring the workpiece into the liquid nitrogen bath prevented the temperature of the workpiece from exceeding −80° C. This facilitated retaining the maximum stored strain energy imparted by the pressing operations.

In step 3, cryogenic rolling consisted of taking approximately 0.040" (0.10 cm) per pass, with a re-cooling step by immersion in the liquid nitrogen bath between each rolling pass. In addition, rotating the target blank ninety degrees with each pass or "cross rolling" facilitated the formation of a balanced grain structure after annealing. As was the case with the pressing steps, it is important that the workpiece be immediately transferred to the liquid nitrogen bath after each rolling pass to ensure that the temperature of the target blank stays as low as possible. After cryogenic rolling is complete, the workpiece returns to ambient temperature.

A recrystallization heat treatment at 250° C. for 4 hours causes the deformed structure of the intensely strained workpiece to be replaced with new, ultrafine grains.

TABLE 1

Processing Steps used for Ultrafine-Grain 99.9993% Pure Copper Sputter Target

| Step | Description |
|---|---|
| 1 | Cut 3" (7.6 cm) length of 127 mm diameter Cu 99.9993% billet |
| 2 | Cryogenically press 3" (7.6 cm) to 1.7" (4.3 cm) to 1" (2.5 cm) final height |
| 3 | Cryogenically roll taking 0.040" (0.10 cm) per pass to 0.325" (0.83 cm) |
| 4 | Water jet cut to diameter of 12.125" (30.8 cm) |
| 5 | Machine both sides to thickness of 0.485" (1.23 cm) |
| 6 | Solder bond to backing plate |
| 7 | Machine assembly to finished dimensions |
| 8 | Ultrasonic inspection of bond integrity |
| 9 | Clean and degrease |
| 10 | Inspect and test |

Metallographic and X-ray diffraction analyses originated from water-jet cut samples taken from the outer ring of the target blank.

The ultrafine copper grain size resulting from cryogenic working and low-temperature annealing is shown in the micrograph in FIG. 1. This sample exhibited complete recrystallization and a grain size of 3.8 μm, as measured according to ASTM E-112 standards.

Sputter testing of the ultrafine grain size (3.8 μm) Cu target of the present example alongside a standard grain size (33 μm) Cu target of identical purity was conducted on an Eclipse sputter tool. Sputtering was conducted through life of the two targets and arcing events were detected and recorded using a microarcing detector (Advanced Energy model 3152302-000). Arcing results are plotted in FIG. 2, showing that the ultrafine grain size reduces arcing events significantly as compared to the standard grain size target.

In addition to an ultrafine grain size, the cryogenically processed target had a dramatic improvement in sputtered surface roughness in comparison to the conventionally processed target. The ultrafine grain size target had a surface roughness of 60 microinches (1.5 micrometers) Ra after sputtering, in comparison to 240 microinches (6.1 micrometers) Ra after sputtering achieved with the comparison target. This reduction in surface roughness may also serve to reduce the intensity of the sputter target's arcing.

Example 2

A 99.9999% pure Cu billet with a 7.0" (17.8 cm) diameter was cut to a length of 6.45" (16.38 cm) and subjected to cryogenic deformation processing as described in Example 1. The billet slice was cooled in liquid nitrogen to approximately 77K and cryogenically upset pressed in 4 steps (re-cooling between each step) to a final height of 4.5" (11.43 cm). The workpiece was then cryogenic rolled down to a final thickness of 1.0 in (2.54 cm). Rolling passes took 0.10 in (0.25 cm) linear reduction per pass, and re-cooling in liquid nitrogen was conducted after every two passes. Following cryogenic deformation, the workpiece was annealed at 250° C. for 2 hours to develop an ultrafine grained structure. The grain size of the target blank of the present example was measured to be 3.6 μm and fully recrystallized. Tensile bars were machined from the target blank and pulled according to ASTM E-8 to gather stress-strain curves. Data from the tensile tests of the material from the present example is compared to previous data from commercial copper sputter targets (45 micron grain size) in FIG. 3.

X-ray diffraction analysis was performed on samples from the target blank processed as described above to investigate the through-thickness texture uniformity of the cryogenically processed workpiece. Orientation ratios for the sample from several thickness locations are shown in FIG. 4. FIG. 4 shows that a relatively consistent, random texture is exhibited by the sample from the present example throughout its thickness.

Given the higher strength afforded by the cryogenic deformation and low temperature annealing process, single-piece or monoblock-style sputter target designs are advantageous for ultrafine grained Cu. The superior elastic modulus of copper (FIG. 5) as compared to aluminum alloy 6061 is evident throughout the relevant temperature range. Also, the higher thermal conductivity of copper as compared to aluminum can result in better thermal management for a sputtering process. Usage of monoblock designs also avoids the costs associated with bonding a target to a backing plate and increases the useful thickness of the sputter target.

The process can fabricate targets of any shape including circular-shaped targets and sheet-like-rectangular-shaped targets. With the cryogenic process, it's possible to achieve minimum grain sizes as fine as 2 to 8 μm in monoblock-designed pure copper targets. Furthermore, reducing grain size improves sputter uniformity in comparison to conventional high-purity sputter targets that are most-often annealed at higher temperatures. In addition, the process provides a more consistent product than conventional wrought methods. Finally, the target contains a fully recrystallized-textured grain with a balanced orientation ratio that further facilitates uniform sputtering.

Although the invention has been described in detail with reference to certain preferred embodiments, those skilled in the art will recognize that there are other embodiments of the invention within the spirit and the scope of the claims.

We claim:

1. A method of forming sputter targets comprising the steps of:
    a) cooling a target blank to a temperature of less than about −50° C., the target blank having grains having an initial grain size and high-purity copper composition;
    b) deforming the cooled target blank to introduce strain into the target blank and to form a deformed grain structure;
    c) recrystallizing the deformed grain structure at a temperature of about 150 to 300° C. to form a target blank having recrystallized grains, the target blank having at least about 99 percent recrystallized grains and the recrystallized grains having a fine grain size smaller than the initial grain size, wherein said fine grain size is 10 μm or less; and
    d) finishing the target blank to form a finished sputter target at a low temperature sufficient to maintain the fine grain size of the finished sputter target at less than 10 μm.

2. The method of claim 1 wherein the cooling occurs in a bath of liquid nitrogen.

3. The method of claim 1 wherein the deforming is rolling.

4. The method of claim 3 wherein the rolling is multiple pass rolling and including the additional step of re-cooling the target blank at least once between rolling passes.

5. A method of forming sputter targets comprising the steps of:
    a) cooling a target blank to a temperature of less than about −50° C., the target blank having grains having an initial grain size and high-purity copper composition;
    b) deforming the cooled target blank to introduce strain into the target blank and to form a deformed grain structure;
    c) recrystallizing the deformed grain structure at a temperature of about 150 to 300° C. to form a target blank having recrystallized grains, the target blank having at least about 99 percent recrystallized grains and the recrystallized grains having a fine grain size smaller than the initial grain size, wherein said fine grain size is 10 μm or less; and
    d) finishing the target blank to form a finished sputter target at a low temperature sufficient to maintain the fine grain size of the finished sputter target at less than about 10 μm and the sputter target blank has a sputter target face, the sputter target face having a grain orientation ratio of at least about 10 percent each of (111), (200), (220) and (311).

6. The method of claim 5 wherein the cooling occurs at a temperature of less than about −80° C.

7. The method of claim 6 wherein the cooling occurs in a bath of liquid nitrogen.

8. The method of claim 5 wherein the deforming is rolling.

9. The method of claim 8 wherein the rolling is multiple pass rolling and including the additional step of re-cooling the target blank at least once between rolling passes.

* * * * *